US006504301B1

(12) United States Patent
Lowery

(10) Patent No.: US 6,504,301 B1
(45) Date of Patent: Jan. 7, 2003

(54) NON-INCANDESCENT LIGHTBULB PACKAGE USING LIGHT EMITTING DIODES

(75) Inventor: Christopher H. Lowery, Fremont, CA (US)

(73) Assignee: LumiLeds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/390,006

(22) Filed: Sep. 3, 1999

(51) Int. Cl.[7] .............................................. H01J 63/04
(52) U.S. Cl. ...................................... 313/512; 362/800
(58) Field of Search ................................. 313/512, 506, 313/509, 113, 503; 362/800

(56) References Cited

U.S. PATENT DOCUMENTS

| | | | |
|---|---|---|---|
| 3,760,237 A | * 9/1973 | Jaffe ............................ 313/512 |
| 3,932,881 A | 1/1976 | Mita et al. ...................... 357/17 |
| 4,035,686 A | * 7/1977 | Fleming ....................... 313/503 |
| 4,168,102 A | 9/1979 | Chida et al. ................... 313/111 |
| 5,208,462 A | 5/1993 | O'Connor et al. ......... 250/493.1 |
| 5,813,753 A | 9/1998 | Vriens et al. ................. 362/293 |
| 5,962,971 A | * 10/1999 | Chen ............................ 313/512 |
| 5,966,393 A | 10/1999 | Hide et al. ...................... 372/23 |

FOREIGN PATENT DOCUMENTS

| | | | |
|---|---|---|---|
| DE | 38 04 293 | 8/1989 | ........... H01L/33/00 |
| DE | 298 04 149 | 6/1998 | ........... H01L/33/00 |
| EP | 0 855 751 | 7/1998 | ........... H01L/51/20 |
| EP | 0 883 195 | 12/1998 | ........... H01L/33/00 |
| EP | 0 890 996 | 1/1999 | ........... H01L/33/00 |
| EP | 1 024 539 | 8/2000 | ........... H01L/33/00 |
| GB | 2 341 274 | 3/2000 | ........... H01L/33/00 |
| JP | 10 190065 | 7/1998 | ........... H01L/33/00 |
| JP | 11 039917 | 2/1999 | ............. F21V/9/08 |
| WO | WO 97/50132 | 12/1997 | ........... H01L/33/00 |

OTHER PUBLICATIONS

Patent Abstracts of Japan, vol. 1998, No. 12, Oct. 31, 1998 & JP 10 190065 A (Nichia Chem Ind Ltd), abstract (1 page).
Patent Abstracts of Japan, vol. 1999, No. 05, May 31, 1999, & JP 11 039917 A (Hewlett Packard Co), abstract (1 page).
European Search Report, Application No. 00307565.2–2203, Jan. 17, 2002, (5 pages).

* cited by examiner

*Primary Examiner*—Vip Patel
*Assistant Examiner*—Joseph Williams
(74) *Attorney, Agent, or Firm*—Skjerven Morrill MacPherson LLP; Brian D. Ogonowsky; Rachel V. Leiterman

(57) ABSTRACT

An LED package and a method of fabricating the LED package utilize a prefabricated fluorescent member that contains a fluorescent material that can be separately tested for optical properties before assembly to ensure the proper performance of the LED package with respect to the color of the output light. The LED package includes one or more LED dies that operate as the light source of the package. Preferably, the fluorescent material included in the prefabricated fluorescent member and the LED dies of the LED package are selectively chosen, so that output light generated by the LED package duplicates natural white light. In a first embodiment of the invention, the prefabricated fluorescent member is a substantially planar plate having a disk-like shape. In a second embodiment, the prefabricated fluorescent member is a non-planar disk that conforms to and is attached to the inner surface of a concave lens. In this embodiment, the optical properties of the fluorescent member are tested by examining an integrated unit formed by the concave lens and the attached fluorescent member. In both embodiments, the LED package includes a layer of encapsulant material that is deposited between the LED dies and the fluorescent member. In a preferred embodiment, the encapsulant material is an optical grade silicone gel, which has a high thermal stability and a desired refractive index for an efficient light extraction.

8 Claims, 6 Drawing Sheets

NON-INCANDESCENT LIGHTBULB PACKAGE USING LIGHT EMITTING DIODES

TECHNICAL FIELD

The invention relates generally to lightbulb packages and more particularly to a lightbulb package that utilizes a phosphor light emitting diode as the light source.

BACKGROUND ART

Common lightbulb packages utilize a light source that includes an incandescent filament within a glass enclosure. However, these glass enclosures are fragile and, as such, can easily break even when subjected to only a moderate impact. In addition, the incandescent filaments themselves are fragile and tend to gradually degrade during use, such that the useful light output generated by the filaments decreases over time. The increasing fragility of the filament with age eventually leads to breakage. Typical incandescent lightbulbs have a mean life of 500 to 4,000 hours, which means that half of a population of lightbulbs will fail in that time because of filament breakage.

With reference to FIG. 1, a conventional halogen lightbulb package 10 of MR-16 outline type is shown. The halogen lightbulb package includes a halogen bulb 12 positioned in the center of a reflector 14, which functions to direct the light produced by the halogen bulb in a generally uniform direction. The package further includes a pair of output terminals 16 and 18 to receive electrical power. The front open face of the package may be protected with a dust cover (not shown). A disadvantage of the package of FIG. 1 is the use of the halogen bulb as the light source. As previously described, the fragility of the glass enclosure and the incandescent filament limits the operating life of the halogen bulb.

Confronted with the above disadvantage, the use of light emitting diodes as a potential light source in a lightbulb package has been examined. Light emitting diodes (LEDs) are well-known solid state devices that can generate light having a peak wavelength in a specific region of the light spectrum. Traditionally, the most efficient LEDs emit light having a peak wavelength in the red region of the light spectrum, i.e., red light. However, a type of LED based on Gallium Nitride (GaN) has recently been developed that can efficiently emit light having a peak wavelength in the blue region of the spectrum, i.e., blue light. This new type of LED can provide significantly brighter output light than traditional LEDs.

In addition, since blue light has a shorter peak wavelength than red light, the blue light generated by the GaN-based LEDs can be more readily converted to produce light having a longer peak wavelength. It is well known in the art that light having a first peak wavelength (the "primary light") can be converted into light having a longer peak wavelength (the "secondary light") using a process known as fluorescence. The fluorescent process involves absorbing the primary light by a photoluminescent phosphor material, which excites the atoms of the phosphor material, and emitting the secondary light. An LED that utilizes the fluorescent process is defined herein as a "phosphor LED." The peak wavelength of the secondary light will depend on the phosphor material. The combined light of unconverted primary light and the secondary light produces the output light of the phosphor LED. Thus, the particular color of the output light will depend on the spectral distributions of the primary and secondary lights. Consequently, a lightbulb package can be configured to generate white output light by selecting an appropriate phosphor material for the GaN-based LED.

U.S. Pat. No. 5,813,753 to Vriens et al. describes a light emitting device having an LED as the light source that utilizes phosphor grains dispersed in an epoxy layer to transform the color of the light emitted by the LED into a desired color. The phosphor grains are described as a single type of phosphor material or a mixture of different phosphor materials, depending on the desired color of the output light. A concern with the use of an epoxy layer that includes phosphor grains as described in Vriens et al. is the difficulty in dispensing the phosphor grains in a repeatable and uniform manner. Such difficulty leads to a population of finished devices having variable performances, i.e., the color of the output light may vary from one finished device to another.

In light of the above concern, what is needed is a lightbulb package having a phosphor LED as the light source that can generate output light of a prescribed color and a method of fabricating such a lightbulb package.

SUMMARY OF THE INVENTION

An LED package and a method of fabricating the LED package utilize a prefabricated fluorescent member that contains a fluorescent material that can be separately tested for optical properties before assembly to ensure the proper performance of the LED package with respect to the color of the output light. The LED package includes one or more LED dies that operate as the light source of the package. Preferably, the fluorescent material included in the prefabricated fluorescent member and the LED dies of the LED package are selectively chosen, so that output light generated by the LED package duplicates natural white light.

In a first embodiment of the invention, the LED package includes four 3 volt gallium nitride-based LED dies that are individually mounted on separate reflector cups, which are attached to a leadframe. In this embodiment, the LED package is configured to be interchangeable with an industry standard MR-16 halogen outline package. However, the LED package may be configured to resemble other industry standard packages, such as MRC-11, MRC-16, PAR-36, PAR-38, PAR-56 and PAR-64. In fact, the LED package may be configured in a completely different lightbulb outline package.

Also attached to the leadframe are output terminals that provide electrical power to the LED dies. The LED dies are electrically connected to the terminals in a specific configuration. In one exemplary configuration, the LED dies are connected in series, so that the overall forward voltage of the package is 12 volts. In an alternative exemplary configuration, the LED dies are connected in series and parallel to create a 6 volt device. The exact electrical configuration of the LED dies, as well as the voltage of the LED dies, are not critical to the invention. Furthermore, the number of LED dies included in the LED package is not critical to the invention.

Deposited over the LED dies is an encapsulant material. The encapsulant material may be epoxy or other suitable transparent material. Preferably, the encapsulant material is an optical grade silicone gel, since silicone gel can withstand exposure to high temperatures without degradation. In addition, silicone gel having a refractive index of 1.5 is currently available, which results in an efficient extraction of light generated by the LED dies.

The prefabricated fluorescent member of the LED package is affixed over the encapsulant material. In this embodiment, the prefabricated fluorescent member is a substantially planar disk that is optically transparent. However, the fluorescent member may be configured in another shape, such as a square or a rectangle, depending on the specification of the LED package. As previously noted, the fluorescent material contained in the prefabricated fluorescent member can be chosen to produce white light. As an example, the fluorescent material may include gadolinium doped, cerium activated yttrium aluminum garnet phosphor grains.

The LED package further includes a lens that is attached to the prefabricated fluorescent member and a reflector that is positioned over the lens. The lens and the reflector ensure that most of the light energy generated by the LED package is output generally along a common direction.

In a second embodiment of the invention, the lens of the LED package is a concave lens and the prefabricated fluorescent member is formed in the inner surface of the concave lens. As such, the prefabricated fluorescent member conforms to the contour of the inner surface of the concave lens. In this embodiment, the optical properties of the fluorescent member can be tested by examining the lens and the attached fluorescent member as a single component.

The method of fabricating the LED package in accordance with the invention includes forming a number of transparent fluorescent members. In a first embodiment, the fluorescent members may be substantially planar plates, such as disks. These plates may be formed by cutting sheets of silicone rubber into the desired shapes. In a second embodiment, the fluorescent members may be non-planar disks that conform to the inner surface of a concave lens. These non-planar disks may be formed by allowing an optically transparent material, such as silicone, polycarbonate or acrylic, to be molded onto the inner surface of a concave lens. Next, the fluorescent members are tested for optical properties. As an example, the fluorescent members may be tested using a monochromatic standard source to activate the phosphor and then measuring the characteristics of the output from the fluorescent members. The tested fluorescent members can then be categorized for a set of optical properties.

After the fluorescent members are tested, one or more GaN-based LED dies are mounted onto a leadframe. Next, a transparent encapsulant material is deposited over the mounted LED dies. Preferably, the encapsulant material is an optical grade silicone gel, which has a high thermal stability and has a desired refractive index for an efficient light extraction. A fluorescent member having a predefine set of optical properties is then placed over the encapsulant material. Next, a lens is attached to the fluorescent member. This step is not applicable for the second embodiment. A reflector is then mounted over the lens. After the reflector has been mounted, a dust cover may be attached to the rim of the reflector to complete the LED package.

An advantage of the invention is that the fluorescent member can be tested prior to assembly which ensures that the finished device will have specific optical properties, thereby reducing production costs that are associated to fabrication of unwanted devices, i.e., devices that do not meet the desired specifications.

DETAILED DESCRIPTION

Figure 1:
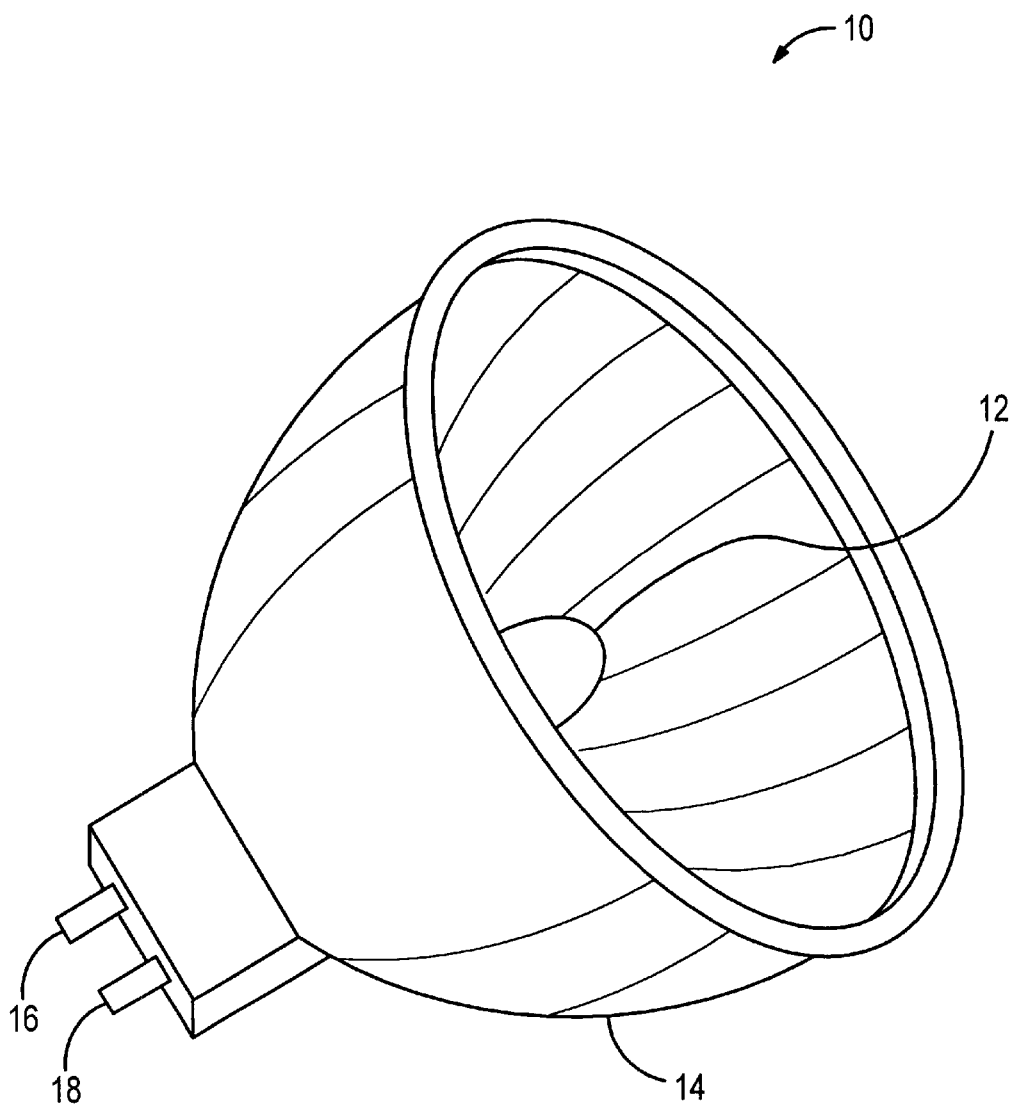
FIG. 1 is a perspective view of a conventional halogen lightbulb package of MR-16 outline type.
Figure 2:
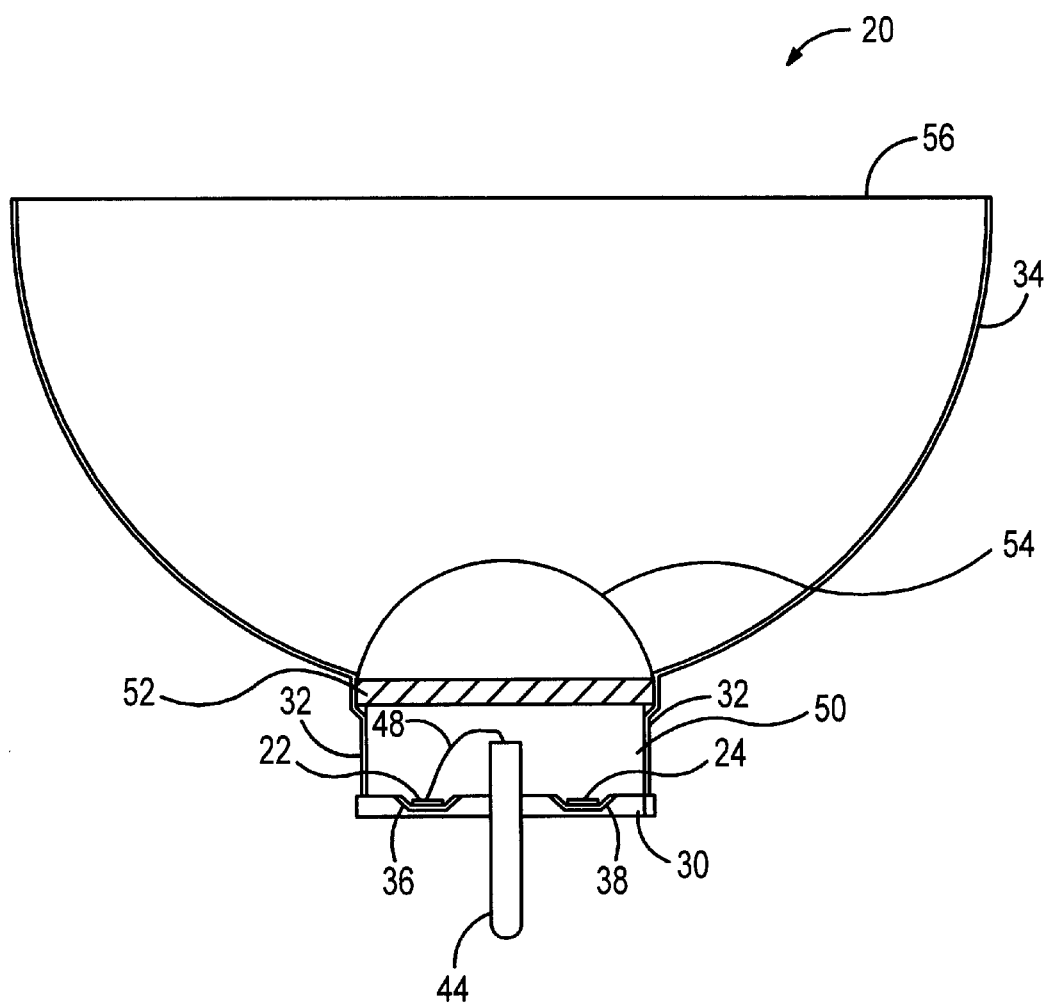
FIG. 2 is a cross-sectional diagram of an LED package in accordance with a first embodiment of the present invention.

With reference to FIG. 2, an exemplary LED package 20 in accordance with a first embodiment is shown. FIG. 2 is a schematic cross-sectional view of the LED package. The LED package is structurally configured to resemble a conventional MR-16 halogen package, such that the LED package is interchangeable with the MR-16 package. However, the LED package utilizes four LED dies (only dies 22 and 24 are exposed in the view of FIG. 2) as the light source for the package, instead of a halogen light bulb, as is the case in the conventional MR-16 package. The LED package has an operating life of 10,000 hours or more, as compared to a halogen package which has a mean operating life of 500 to 4,000 hours. Furthermore, unlike halogen packages which fail by filament breakage, the LED package degrades by a gradual reduction in light output. Typically, at the end of the operating life of 10,000 hours, the LED package would still generate 50% of the original light output.

Figure 3:
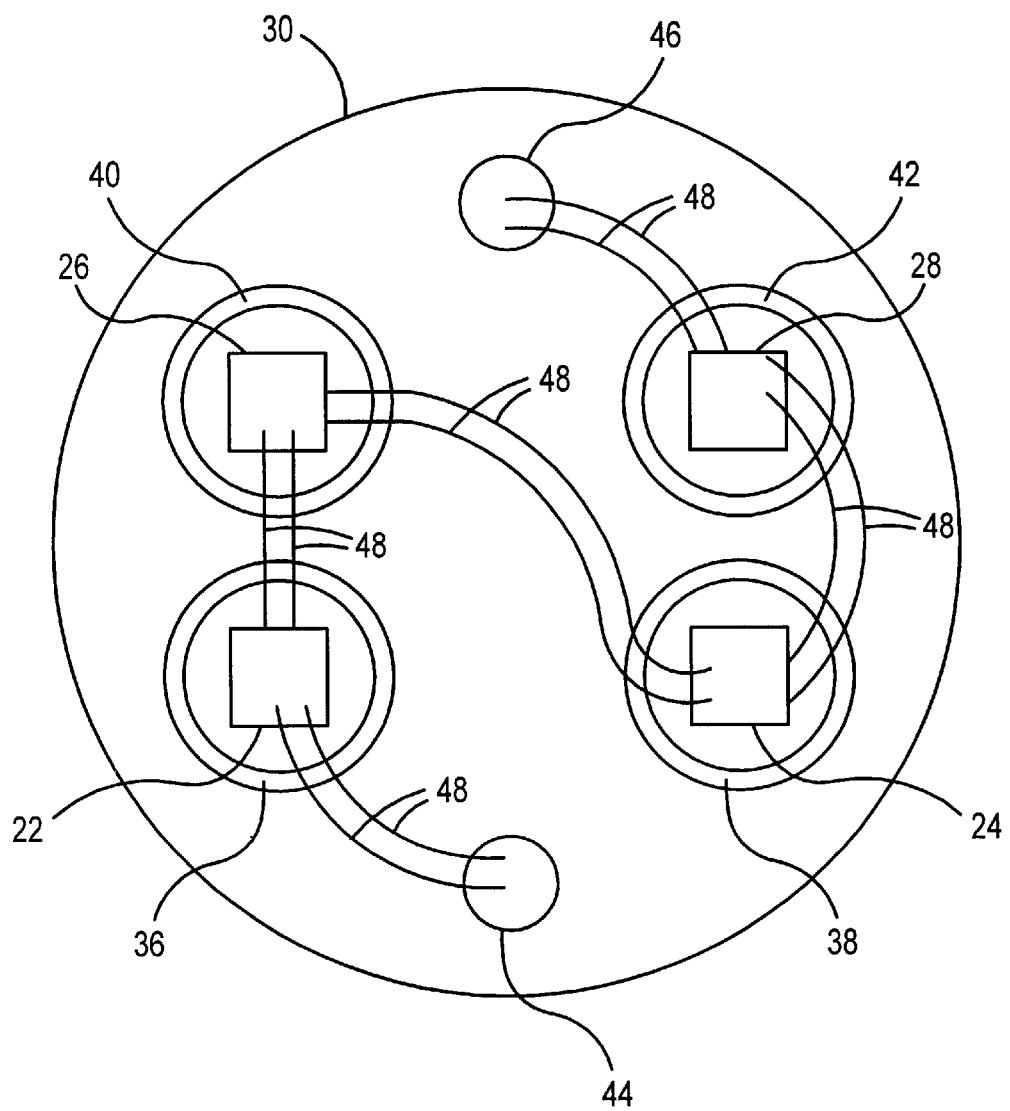
FIG. 3 is a top view of a leadframe of the LED package of FIG. 2 in which mounted LED dies are electrically connected in a 12 volt configuration.

The LED package 20 includes a leadframe 30 that is attached to the bottom of a cylindrical casing 32. As an example, the leadframe may be composed of steel or copper. Also attached to the casing is a specular reflector 34 that directs the light generated by the LED package. Referring now to FIGS. 2 and 3, four LED dies 22, 24, 26 and 28 of the package are affixed to the leadframe via reflector cups 36, 38, 40 and 42, respectively. Preferably, the LED dies are gallium nitride-based LEDs (indium doped, gallium nitride on sapphire) that emit blue light when activated by an applied electrical signal. The configuration of the LED dies and the reflector cups on the leadframe is best illustrated in FIG. 3, which is a top view of the leadframe. The LED dies are mounted into the cavities of the reflector cups, as most clearly shown in FIG. 2. Preferably, the reflector cups are made of a material having a coefficient of thermal expansion (CTE) that matches the LED dies. As an example, the reflector cups may be made of silver plated molybdenum. The reflector cups are swaged into the leadframe, thereby affixing the LED dies to the leadframe. In an alternative embodiment, a molybdenum disk (not shown) is attached underneath each LED die, for example, by solder. The molybdenum disk with the attached LED die is then mounted on the leadframe. This method also achieves the desired CTE matching. The LED dies are electrically connected to an anode terminal 44 and a cathode terminal 46 that are also attached to the leadframe.

Figure 4:
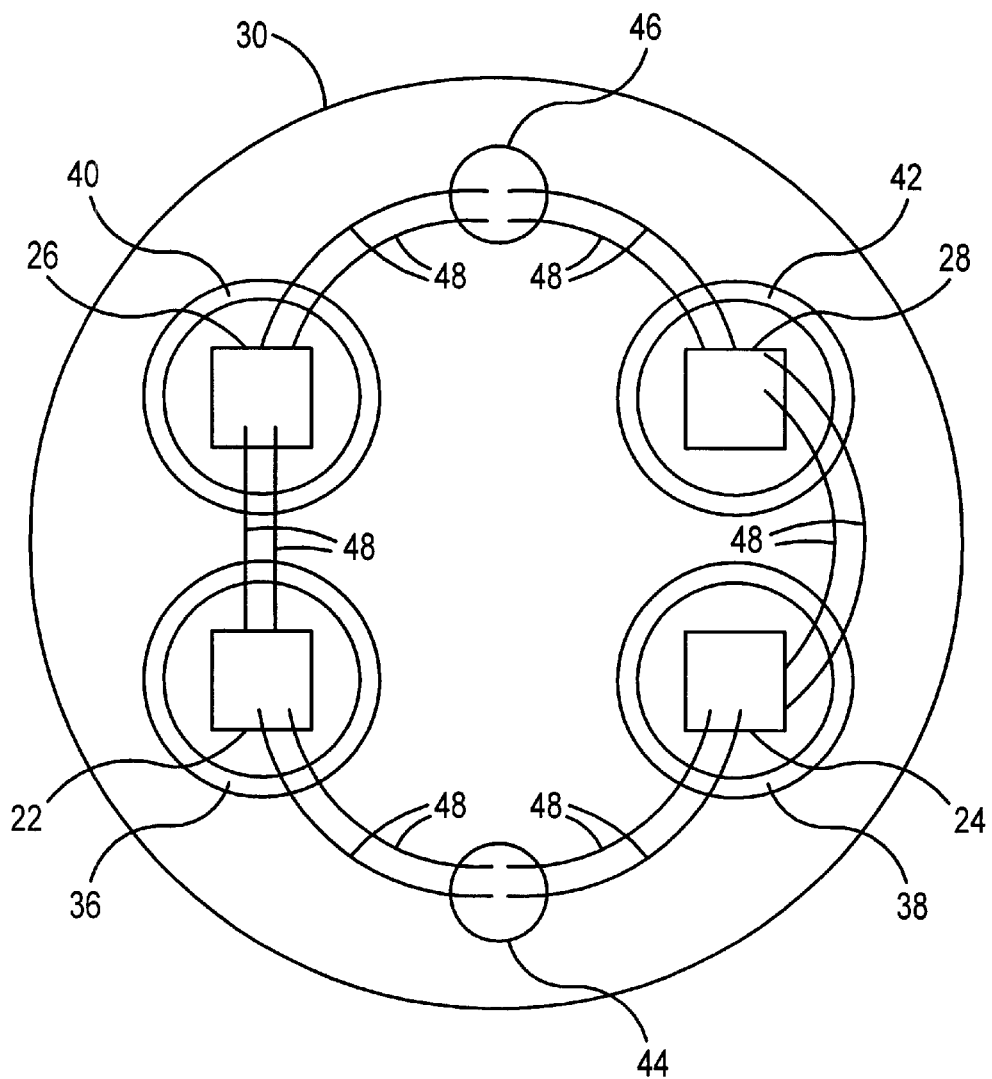
FIG. 4 is a top view of the leadframe of the LED package of Fig. in which mounted LED dies are electrically connected in a 6 volt configuration.

The LED dies 22, 24, 26 and 28 selected to be included in the LED package 20 can be of the type that enables activation at a low forward voltage of less than 3 volts each, at their maximum rated drive current, such that the four LED dies wired in series result in an overall forward voltage of a nominal 12 volts. The series connection is illustrated in FIG. 3. This would make the package conform to 12 volt incandescent packages. However, if a different series voltage is required, other arrangements of LED dies could be implemented. For example, three 4 volt LED dies could be selected and wired in series to achieve the same overall forward voltage of 12 volts. The exact type and number of LED dies included in the package and the configuration by which the LED dies are connected can vary, depending on the desired device to be fabricated. As an example, four 3 volt LED dies can be wired in series/parallel, as shown in FIG. 4, to achieve a 6 volt device. The LED dies may be electrically connected by wirebonds, as illustrated in FIGS. 2, 3 and 4. As shown in FIG. 3, more than one wire may be used in order to carry the drive currents between terminals and the LED dies. Although the electrical connections shown in FIGS. 2, 3 and 4 are provided by wirebonds, other electrical connection techniques common in the semiconductor industry may instead be utilized, such as flip chip solder bumping.

Preferably, the size of the LED dies 22, 24, 26 and 28 is such that the photometric power is of a useful range. This may require the size of the LED die to be 2.89 square millimeter, which would result in a current density on the die greater than 70 amps per square centimeter. For example, if the photometric power of these LED dies is 5 lumens (per watt of input power) and the input power to an assembly of four dies is 24 watts (12 volts at 2 amps), then the total optical output power is 5×24=120 lumens of blue light. When this is modified into white light, a typical output in white light is raised by a factor of 1.9, which results in a final white light output of 120×1.9=228 lumens.

Turning back to FIG. 2, the LED package 20 further includes a region 50 of encapsulant material over the LED dies. To extract the maximum amount of light from the LED dies 22, 24, 26 and 28, an optical grade material of similar refractive index must be in contact with the LED dies. Sapphire LED substrates commonly have a refractive index of 2.5. Such LEDs are commonly encapsulated with a material with a refractive index of 1.5. Application of Snell's Law shows that only light emitted from the active region with an angle θ of about 0.644 radians (36.9 degrees) to the normal of the interface with the encapsulant will escape the LED. In such case, a fraction of 1-Cos θ or 20% of the internally generated light will escape. An equal amount of light is emitted from the horizontal edges of the LED die. The edge light from the LED die 22, 24, 26 or 28 is reflected and directed forward by the reflective cavity of the reflector cup 36, 38, 40 or 42 in which the LED die is mounted.

In addition to the refractive index issue, the encapsulant material of the region 50 must also be able to withstand the great heat generated by the LED dies 22, 24, 26 and 28 during their operation. The surface temperature of the LED dies may easily reach 200 degrees Centigrade. Under such circumstances, epoxy would rapidly undergo thermal degradation during use, becoming progressively more yellow and absorbing much of the radiation from the LED dies, which would render the device useless. For the above reasons, the encapsulant used for the region is preferably made of an optical grade silicone gel material, although other less desirable transparent materials may be used, such as epoxy. Silicones have excellent thermal stability. In addition, a silicone gel material having a refractive index of 1.5 is available to maximize light extraction. However, the encapsulating silicone material must be extremely soft, so that it does not exert stress on the bond wires 48 or die and break them during operation of the device 20. This would occur due to differential expansion between the silicone and the body of the device (or the molybdenum reflector 36, 38, 40 or 42). Typically, the CTE of these silicone materials is 80 parts per million per unit length per degree Centigrade. The metal body (for example copper) has a CTE of 10 to 12 parts per million per unit length per degree Centigrade, so the difference in expansion from the device being on and off is a factor of 8 and this difference can create sufficient movement of the encapsulant to damage the bond wires or die.

Positioned adjacent to the region 50 of encapsulant material is a fluorescent plate 52 that contains a phosphor material. The fluorescent plate is a prefabricated component that can be tested for optical properties, prior to the assembly of the LED package. The testing of the fluorescent plate relates to homogeneity of the phosphor contained within the plate and relates to the correct phosphor concentration. As an example, the fluorescent plate can be made of soft, optically clear, silicone rubber. However, the plate can be made of other optically transparent materials, such as polycarbonate or acrylic, that is dispersed with phosphor. The phosphor contained in the fluorescent plate will depend on the desired wavelength characteristics of the output light generated by the LED package 20. As an example, the plate may contain gadolinium (Gd) doped, cerium (Ce) activated yttrium aluminum garnet (YAG) phosphor grains ("Ce:YAG phosphor grains") to convert some of the blue radiation (wavelength of 460–480 nm) emitted by the LED dies 22, 24, 26 and 28 to a longer wavelength radiation. The use of Ce:YAG phosphor grains will allow the fluorescent plate to absorb the emitted blue light and upshift the optical energy to a mean wavelength of approximately 520 nm. This resulting emission is a broadband light stretching from 480 to 620 nm. The combination of this emission with the remaining blue light, i.e., the unconverted emitted blue light, creates a final emission with color rendering that duplicates natural white light.

In the above example, the fluorescent plate 52 may be modified by the inclusion of several other rare earth metals, such as samarium, praseodymium or other similar materials, to improve color rendering of the LED package 20. In addition, other phosphors may be added to create emissions in other wavelengths to modify the spectral distribution of the output light generated by the LED package. The exact types of fluorescent material contained within the plate are not critical to the invention.

In the illustrated embodiment, the fluorescent plate 52 is a substantially planar disk that resembles the shape of leadframe 30, as shown in FIGS. 3 and 4. However, in other embodiments where the LED dies 22, 24, 26 and 28 are arranged in a different configuration such that the leadframe is non-circular, the fluorescent plate can be shaped to correspond to the leadframe and the configuration of the mounted LED dies. For example, the fluorescent plate may be a substantially planar rectangular plate, if the LED dies of the package are arranged in a rectangular configuration on a rectangular leadframe.

The LED package 20 further includes a lens 54 that is attached to the fluorescent plate 52 to collimate the light emitted from the device and distribute the light uniformly into the reflector 34. The radiation pattern from the lens is designed to fill the reflector, which is situated above the lens. As an example, the lens may be made of silicone. Alternatively, the lens may be made of a polycarbonate or an acrylic material. Situated above the lens and attached to the rim of the reflector is a dust cover 56, which serves to protect the finished device.

Figure 5:
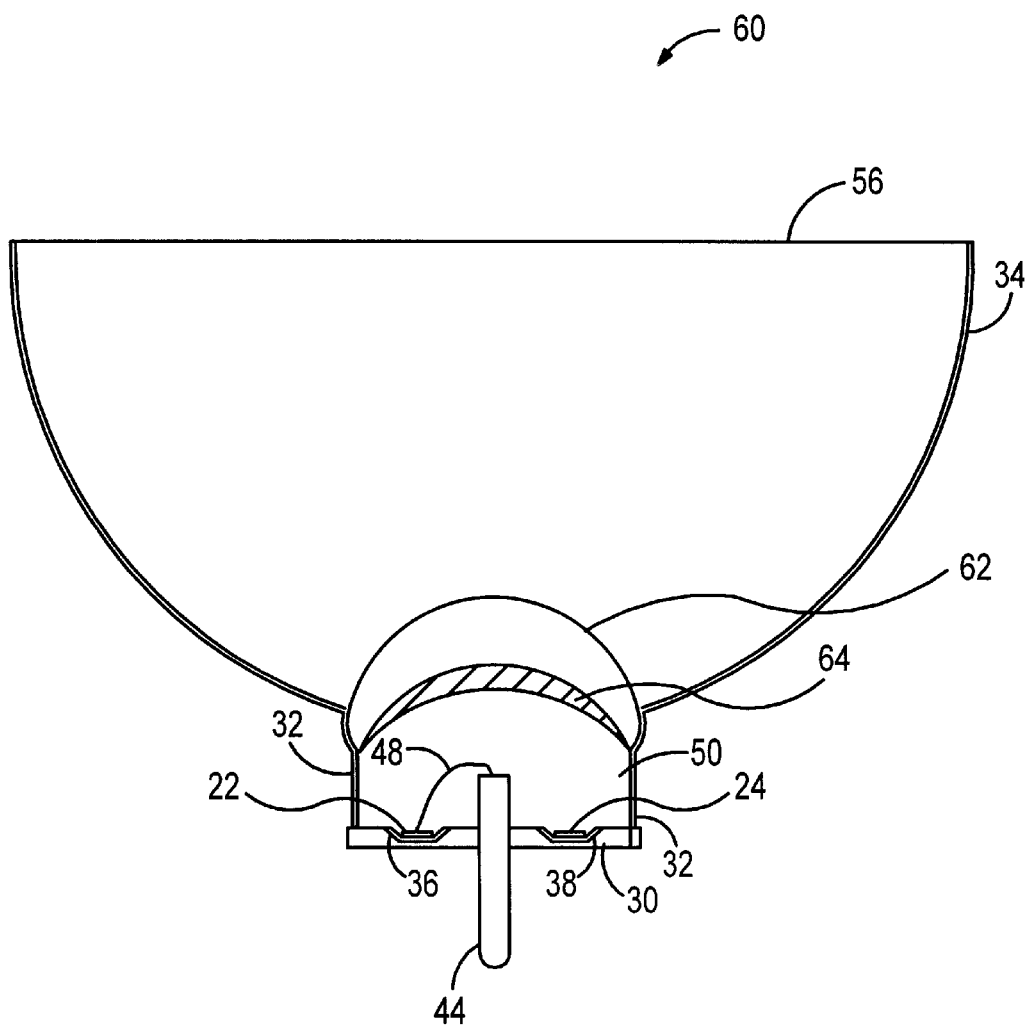
FIG. 5 is a cross-sectional diagram of an LED package in accordance with a second embodiment of the invention.

Turning now to FIG. 5, an exemplary LED package 60 in accordance with a second embodiment is shown. The LED package of FIG. 5 includes most of the components of the LED package of FIG. 2. The only significant difference is that the lens 54 and the fluorescent plate 52 included in the LED package 20 are replaced with a concave lens 62 and a molded fluorescent non-planar disk 64. The fluorescent non-planar disk is formed on the inside surface of the concave lens. Thus, the lens and the molded non-planar disk are a single prefabricated component of the LED package. That is, the lens and the non-planar disk become an integrated member that can be tested for optical properties as a unit, separately from other components of the package. Therefore, in this embodiment, the optical properties of the fluorescent non-planar disk are tested after the fluorescent non-planar disk has been formed on the inner surface of the concave lens.

Although the LED packages 20 and 60 of FIGS. 2 and 5 have been illustrated and described as being configured as an MR-16 type outline package, these LED packages may be configured in other types of industry standard outline packages, such as MRC-11, MRC-16, PAR-36, PAR-38, PAR-56, and PAR-64.

Figure 6:
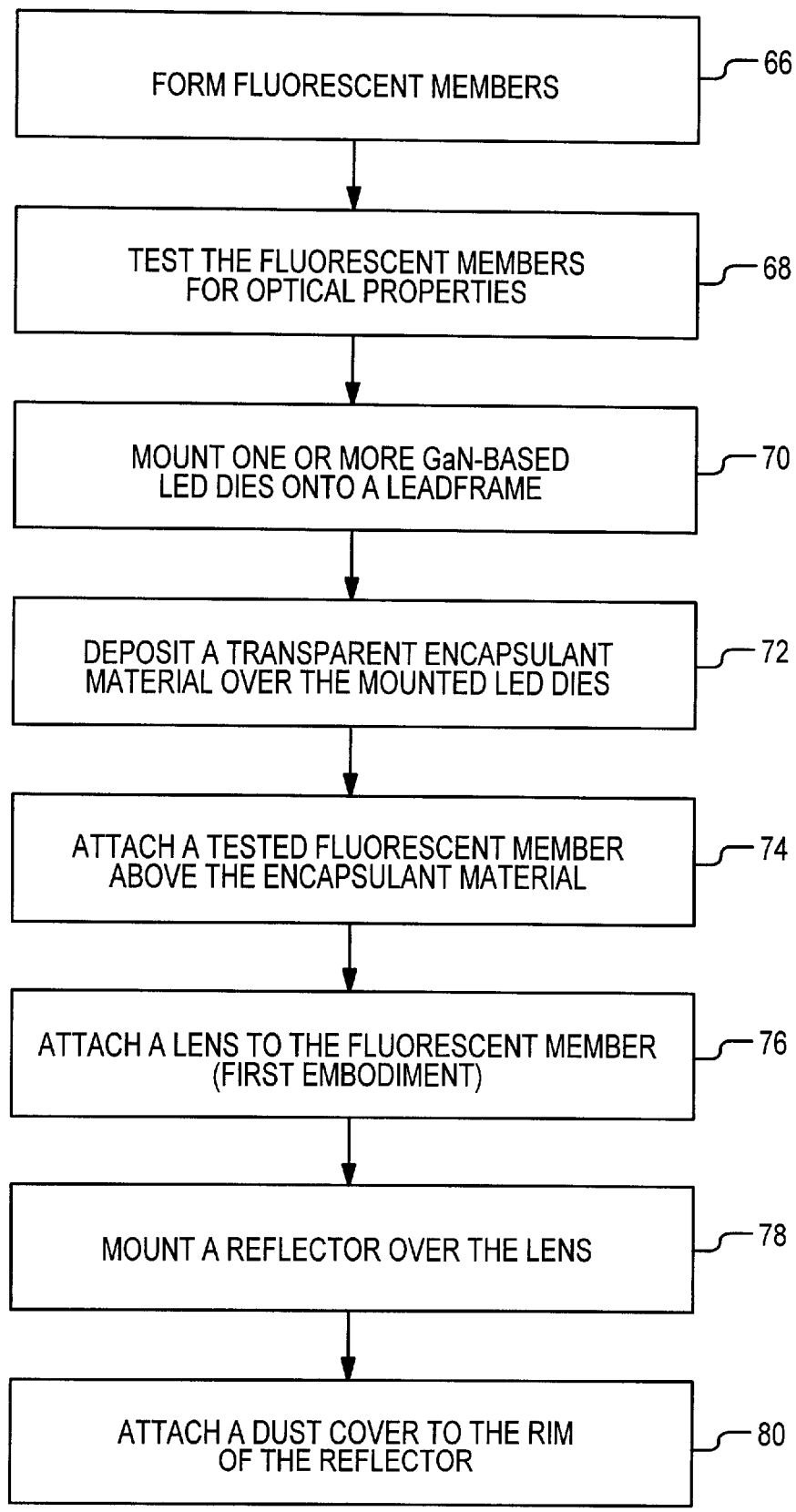
FIG. 6 is a flow diagram of a method of fabricating an LED package in accordance with the invention.

A method of fabricating an LED package, such as the LED packages 20 and 60 of FIGS. 2 and 5, will be described with reference to FIG. 6. At step 66, a number of fluorescent members that are optically transparent are formed. The fluorescent members contain a phosphor material that is distributed within the fluorescent members. Preferably, the fluorescent members are made of silicone rubber and contain Ce:YAG phosphor grains. In a first embodiment, the fluorescent members are shaped plates that are formed by cutting sheets of optically clear material that contains the phosphor material into a shape that corresponds to the axial configuration of the LED packages to be fabricated. For example, the finished plates may be formed in the shape of disks. In a second embodiment, the fluorescent members are shaped as non-planar disks that conform to the inner surfaces of concave lenses. In this embodiment, the fluorescent members are formed by molding an optically transparent material, such as polycarbonate or acrylic, that has been dispersed with a fluorescent material into the non-planar disk shape using the contours of the concave lens. During step 68, the fluorescent members are tested for optical properties. As an example, the fluorescent members may be tested using a monochromatic standard source to activate the phosphor and then measuring the output from the fluorescent members. The tested fluorescent members can then be "binned" or categorized for a set of optical properties. Those fluorescent members exhibiting similar properties can be used to produce finished devices of very similar optical properties. Thus, devices can be produced to meet specific customer needs with respect to color temperature and output spectrum. Since the optical properties are known prior to the production of the devices, unwanted devices with optical characteristics that do not meet the desired specifications are avoided, thereby reducing production costs.

At step 70, one or more GaN-based LED dies are mounted onto a leadframe. During step 72, a transparent encapsulant material is deposited over the LED dies. Preferably, a silicone gel material is used as the encapsulant, since the silicone gel material has excellent thermal characteristics and also has a desired refractive index. Next, a tested fluorescent member having specific optical properties is attached above the encapsulant material, during step 74. Clear silicone adhesives may be used to attach the fluorescent member to the encapsulant material. Alternatively, the fluorescent member may simply be pressed firmly against the encapsulant material. Next, during step 76, a lens is attached to the fluorescent member. Similar to the attachment of the fluorescent member to the encapsulant material, the lens may be attached to the fluorescent member using silicone adhesives or by pressing the lens firmly against the fluorescent member. In the second embodiment, where the lens and the fluorescent member is a single prefabricated component, this step is not applicable. During step 78, a reflector is mounted over the lens. After the reflector has been mounted, a dust cover may be attached to the rim of the reflector, during step 80.

What is claimed is:

1. A light source package comprising:
   a light source that generates primary light having a first spectral distribution;
   a layer of transparent material over said light source that encapsulates said light source; and
   a nonconformal wavelength converter attached to said layer of transparent material, said wavelength converter being optically coupled to said light source to receive said primary light, said wavelength converter comprising:
      a base material selected from the group consisting of acrylic, polycarbonate, and soft, optically clear, silicone rubber; and
      a fluorescent material that emits secondary light in response to absorption of said primary light to produce a composite output light, the fluorescent material being contained in the base material.

2. The package of claim 1 wherein said wavelength converter is shaped as a substantially planar plate.

3. The package of claim 1 further comprising a concave lens adjacent to said wavelength converter, said wavelength converter having a non-planar disk shape that conforms to an inner surface of said concave lens.

4. The package of claim 1, wherein said transparent material of said layer that encapsulates said light source is an optical grade silicone gel.

5. The package of claim 1 wherein a physical size and shape of an exterior of said package are compatible with an exterior physical size and shape of an industry standard package selected from a group consisting of MRC-11, MR-16, MRC-16, PAR-36, PAR-38, PAR-56, and PAR-64.

6. The package of claim 1, wherein said light source includes a plurality of gallium nitride-based light emitting diodes.

7. The package of claim 1, further comprising:
   a leadframe to which the light source is attached; and
   a lens, the lens having a radiation pattern designed to fill a reflector.

8. The package of claim 1, further comprising a lens, the lens being attached to the wavelength converter.

* * * * *